(12) United States Patent
Chiang et al.

(10) Patent No.: US 8,134,417 B2
(45) Date of Patent: Mar. 13, 2012

(54) AUTOMATIC AMPLITUDE CONTROL FOR VOLTAGE CONTROLLED OSCILLATOR

(75) Inventors: Meei-Ling Chiang, Cupertino, CA (US); Dennis M. Fischette, Mountain View, CA (US); Alvin Leng Sun Loke, Ft. Collins, CO (US); Michael M. Oshima, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 91 days.

(21) Appl. No.: 12/813,071

(22) Filed: Jun. 10, 2010

(65) Prior Publication Data
US 2011/0304407 A1 Dec. 15, 2011

(51) Int. Cl.
  H03B 5/12 (2006.01)
  H03L 5/00 (2006.01)
(52) U.S. Cl. ............... 331/109; 331/117 FE; 331/177 V; 331/179; 331/183
(58) Field of Classification Search ............. 331/34, 331/36 C, 109, 117 R, 117 FE, 117 D, 167, 331/177 R, 177 V, 179, 182, 183
See application file for complete search history.

(56) References Cited

U.S. PATENT DOCUMENTS

| | | | | |
|---|---|---|---|---|
| 6,680,655 B2 * | 1/2004 | Rogers | ................. | 331/109 |
| 6,838,952 B2 * | 1/2005 | Ramet | ................. | 331/183 |
| 7,583,151 B2 | 9/2009 | Fan | | |
| 7,603,244 B2 | 10/2009 | Wang | | |
| 7,688,153 B2 | 3/2010 | Jacobsson | | |
| 7,728,679 B2 | 6/2010 | Wang | | |

* cited by examiner

*Primary Examiner* — David Mis
(74) *Attorney, Agent, or Firm* — Meyertons, Hood, Kivlin, Kowert & Goetzel, P.C.; Erik A. Heter (57) ABSTRACT

A circuit and method for calibrating a VCO (voltage controlled oscillator) is disclosed. In one embodiment, a circuit includes a VCO and a bias control circuit coupled to a tail node of the VCO. An amplitude control unit may also be coupled to the tail node, wherein the amplitude control unit is configured to determine the amplitude of a VCO output signal based on a voltage present on the tail node. The amplitude control unit may also be configured to generate a bias voltage based on the amplitude of the VCO output signal and a target voltage. The bias control circuit may be coupled to receive the bias voltage from the amplitude control unit and may be further configured to adjust the voltage on the tail node based on the received bias voltage.

22 Claims, 7 Drawing Sheets

AUTOMATIC AMPLITUDE CONTROL FOR VOLTAGE CONTROLLED OSCILLATOR

BACKGROUND

1. Field of the Invention

This invention relates to electronic circuits, and more particularly, to voltage controlled oscillators (VCOs).

2. Description of the Related Art

Phase-locked loops (PLLs) are commonly used for the generation of oscillating signals in a wide variety of electronic circuits. For example, PLLs may be used in digital circuits for clock generation and reproduction, in radio transmitter and receiver circuits for generation of signals at radio frequencies, and so forth.

A typical PLL includes a phase detector coupled to receive a reference signal, a low pass filter coupled to the output of the phase detector, and a voltage controlled oscillator (VCO). The output of the VCO may provide the output signal of the PLL, and may also be fed back to an input of the phase detector via a feedback loop. In some instances, the output of the VCO may be divided before being provided to the phase detector. The phase detector is configured to compare the reference signal and the signal received from the feedback loop, and adjust its output voltage accordingly.

One type of VCO commonly used in PLLs utilizes an LC (inductive-capacitive) tank circuit. During operation of a VCO based on an LC tank circuit, an electric current may alternate between the inductor and the capacitor at a resonant frequency of the circuit. To achieve a low-noise VCO output, the oscillation signal amplitude must be sufficiently large such that the oscillation frequency is more resilient to noise sources. However, the amplitude cannot be excessive as the large amplitude swing will otherwise cause varactor capacitance averaging and consequently degrade the oscillator tuning range.

SUMMARY OF THE DISCLOSURE

A method and circuit for calibrating a VCO is disclosed. In one embodiment, a circuit includes a VCO and a bias control circuit coupled to a tail node of the VCO. An amplitude control unit may also be coupled to the tail node, wherein the amplitude control unit is configured to determine the amplitude of a VCO output signal based on a voltage present on the tail node. The amplitude control unit may also be configured to generate a bias voltage based on the voltage present on the tail node and a target voltage. The bias control circuit may be coupled to receive the bias voltage from the amplitude to control unit and may be further configured to adjust the voltage on the tail node based on the received bias voltage.

In one embodiment, a method for calibrating a VCO includes determining an amplitude of a VCO (voltage controlled oscillator) output signal based on a voltage present at a tail node of the VCO. The method further includes generating a first indication if the amplitude is not within a specified range, and generating a second indication if the amplitude is within the specified range. Responsive to generation of the first indication, the method includes adjusting the amplitude, wherein adjusting the amplitude comprises adjusting the tail voltage. The method further includes discontinuing adjustment of the amplitude responsive to generation of the second indication.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

A method and apparatus for calibrating the amplitude of an output signal of a voltage-controlled oscillator (VCO) is described below by way of the examples in the drawings. The VCO may include an LC (inductive-capacitive) tank circuit. Monitoring of the output signal may be performed non-invasively by monitoring a tail node of the VCO instead of through a direct coupling to the LC tank circuit. By non-invasively monitoring the amplitude of the VCO output signal, problems such as loading (which can reduce the turning range of the LC tank circuit) may be avoided.

An amplitude control unit configured to calibrate the amplitude of the VCO output signal may determine its amplitude based on the voltage present on the tail node. Based on the tail node voltage and a target voltage, the amplitude control unit may determine whether or not the amplitude of the VCO output signal is within a specified range (e.g., if the tail node voltage exceeds the target voltage). If the amplitude is not within the specified range, it may be adjusted by adjusting the voltage at the tail node. A first indication may be generated when the amplitude is not within the specified range. Adjustment of the tail node voltage, and thus the amplitude, may continue when the first indication remains asserted. When the amplitude is adjusted to being within the specified range (e.g., when the tail node voltage is less than or equal to the target voltage), a second indication may be generated. Responsive to generation of the second indication, adjustments of the amplitude may be discontinued.

The amplitude control unit may include analog and digital portions, with the digital portion configured to re-use the circuitry of the analog portion. Both analog and digital calibrations may be performed. Analog calibration and control of the VCO output signal may be performed as a closed loop process. Digital calibration of the VCO output signal may initially be performed as a closed loop process, although the loop may be opened once the calibration is complete. It is noted that the embodiments described below are exemplary, and are not intended to be limiting. Various embodiments of the method and apparatus will now be described in further detail.

With respect to the transistors shown in various drawings, it is noted that PMOS (p-channel metal oxide semiconductor) transistors are designated with a 'P' (e.g., P1, P2, etc.), while NMOS (n-channel metal oxide semiconductor) transistors are designated with an 'N' (e.g. N1, N2, etc.). Furthermore, while PMOS and NMOS transistors are shown in various points of the circuit topologies of FIGS. 2 and 4, it is noted that these arrangements are not intended to be limiting, and that embodiments of circuitry having the opposite polarity (and corresponding arrangements) are possible and contemplated for any of the embodiments discussed below.

Figure 1:
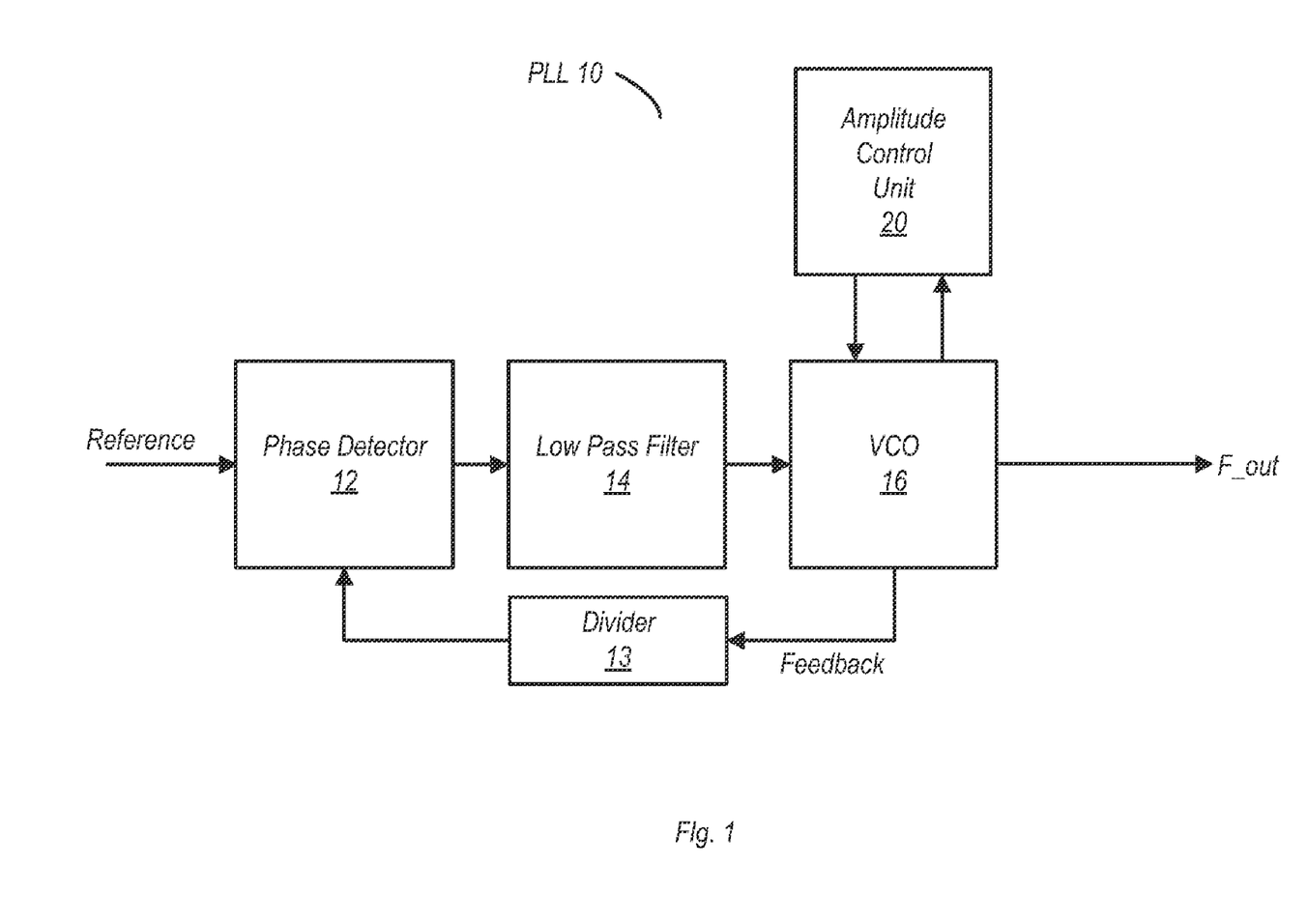
FIG. 1 is a block diagram of one embodiment of a phase-locked loop (PLL) including a voltage controlled oscillator (VCO)

Phase Locked Loop:

Turning now to FIG. 1, a block diagram of one embodiment of a phase-locked loop (PLL) including a voltage controlled oscillator (VCO) is shown. In the embodiment shown, PLL 10 includes a phase detector 12, low pass filter 14, VCO 16, a feedback path including divider 13, and amplitude control unit 20. PLL 10 is configured to receive a reference clock signal ('Reference') at a first frequency, and may provide an output clock signal ('F_out') at a frequency that may be different from the first frequency.

Phase detector 12 is coupled to receive the reference clock signal and a signal from the feedback loop, and is configured to compare the phases of these two signals. Responsive to performing the comparison, phase detector may generate an error signal as a voltage that is received by low pass filter 14. Low pass filter 14 may filter out fluctuations in error signal that may result due to various factors such as corresponding fluctuations in the reference clock signal. The output of low pass filter 14 may then be received by VCO 16, which may generate an output signal at a frequency that corresponds to the voltage of the received signal. In addition to providing an output signal, VCO 16 is also coupled to provide a signal at the frequency of the output signal to divider 13 in the embodiment shown. Divider 13 may generate a signal at a divided frequency, with respect to the output signal, to provide back to phase detector 12 for comparison. Accordingly, changing the divisor of divider 13 (if changeable) may thus result in a corresponding change of the output frequency.

PLL 10 also includes amplitude control unit 20, which may perform multiple functions. A first of these functions is to ensure that the output signal of VCO 16 is actually oscillating. As will be explained in further detail below, amplitude control unit 20 may force VCO 16 to provide an oscillating output signal responsive to determining that the output signal is initially not oscillating. A second function provided by amplitude control unit 20 in the embodiment shown is to calibrate the amplitude of the output signal. In one embodiment, a calibration routine may be performed to calibrate the amplitude of the VCO output signal based on a target voltage during an initialization of PLL 10. Upon completion of the calibration routine, a control loop may be opened, wherein no further control of the amplitude is provided. However, amplitude control unit 20 may be configured to provide continuous, closed loop control of the amplitude of the VCO output signal in some embodiments. Moreover, in some embodiments amplitude control unit 20 may be arranged such that switching between open loop control and closed loop control are possible.

Figure 2:
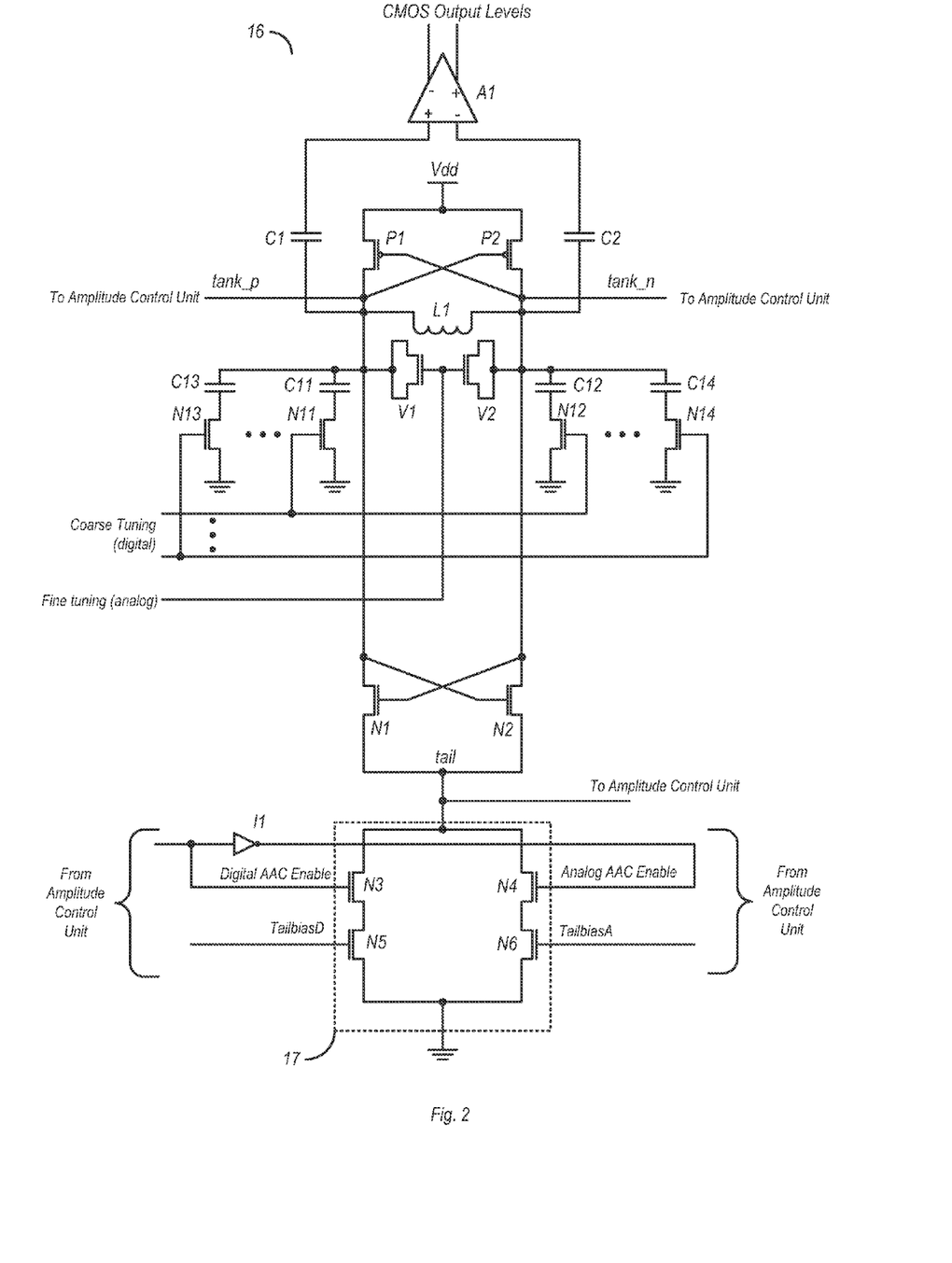
FIG. 2 is a schematic diagram of one embodiment of a VCO having an LC (inductive-capacitive) tank circuit with a tail node coupled to a bias control circuit.

Voltage Controlled Oscillator with Bias Control Circuit:

FIG. 2 is a schematic diagram of one embodiment of a VCO having an LC (inductive-capacitive) tank circuit with a tail node coupled to a bias control circuit. In the embodiment shown, VCO 16 includes a pair of cross coupled inverters, the first of which includes transistors P1 and N1, and a second of which includes transistors P2 and N2. The cross-coupled inverters formed by these transistors in the embodiment shown are coupled to an LC tank circuit comprising inductor L1 and varactors V1 and V2. Nodes 'tank_p' and 'tank_n' in the embodiment shown are AC (alternating current) coupled to the inputs of amplifier A1 via capacitors C1 and C2, respectively. Amplifier A1 may be configured to amplify the difference between the signals on nodes 'tank_p' and 'tank_n' and to thus provide a VCO output signal at CMOS (complementary metal oxide semiconductor) output levels. The VCO output signals may also be taken from nodes 'tank_p' and 'tank_n'. Nodes 'tank_p' and 'tank_n' in the embodiment shown are also coupled to an amplitude control unit, which will be discussed in further detail below.

The tank circuit may amplify noise at a resonant frequency. Tuning of the resonant frequency (and thus the frequency of the output signal provided by the VCO) may be accomplished by through varactors V1 and V2 and N11-N14 in the embodiment shown. More particularly, analog fine-tuning of the VCO output signal frequency may be accomplished by varying a voltage on the gate terminals of varactors V1 and V2 (which are NMOS transistors coupled as capacitors in this embodiment). Digital coarse tuning may be accomplished by varying the respective gate voltages of transistors N11-N13 on the left side of the drawing and N12-N14 on the right side of the drawing. Each of these transistors is AC coupled to one of nodes 'tank_p' or 'tank_n' through respective capacitors (e.g., N11 via C11, N12 via C12, etc.). When particular ones of these transistors are active, an amount of capacitance between their respective tank nodes (i.e. 'tank_p' or 'tank_n') is increased, while a path to shunt AC signals at certain frequencies to ground is provided.

In the embodiment shown, a bias control circuit 17 is coupled to the tail node ('tail') of VCO 16. Controlling the amplitude of the VCO output signal (as well as the signals produced on nodes 'tank_p' and 'tank_n') may be accomplished by adjusting the bias voltage on the tail node. In the embodiment shown, the voltage swing of the signals produced on node 'tank_p' and 'tank_n' is from the supply voltage 'Vdd' to the voltage on the tail node. Accordingly, increasing the amplitude of the VCO output signal may be accomplished by reducing the tail voltage, which in turn increases the voltage swing between the supply voltage and the tail voltage. In this particular embodiment, the tail voltage may be changed through one of transistors N5 or N6. The gate terminal of transistor N5 in the embodiment shown is coupled to receive a signal 'TailbiasD' from amplitude control unit 20. Similarly, transistor N6 is coupled to receive the signal 'TailbiasA' from amplitude control unit 20. An enable signal, 'Digital AAC Enable' (where AAC=automatic amplitude control) may also be received by the gate terminal of transistor N3, with transistor N4 coupled to receive its complement, Analog AAC Enable, on its gate terminal by way of inverter I1.

In the embodiment shown, transistor N5 may be used to control the bias voltage when transistor N3 is active. Control of the voltage on the tail node may be accomplished by varying the voltage on the gate of transistor N5. If transistor N3 is on (and thus N5 is off in this particular embodiment), transistor N6 may be used to control the bias of the tail node through variation of the voltage on its gate. In either case, the voltage on the tail node may be fed back to amplitude control unit 20. As will be explained in further detail below, amplitude control unit 20 may use the received tail voltage as information for determining and adjusting the amplitude of the VCO output signal.

Figure 3:
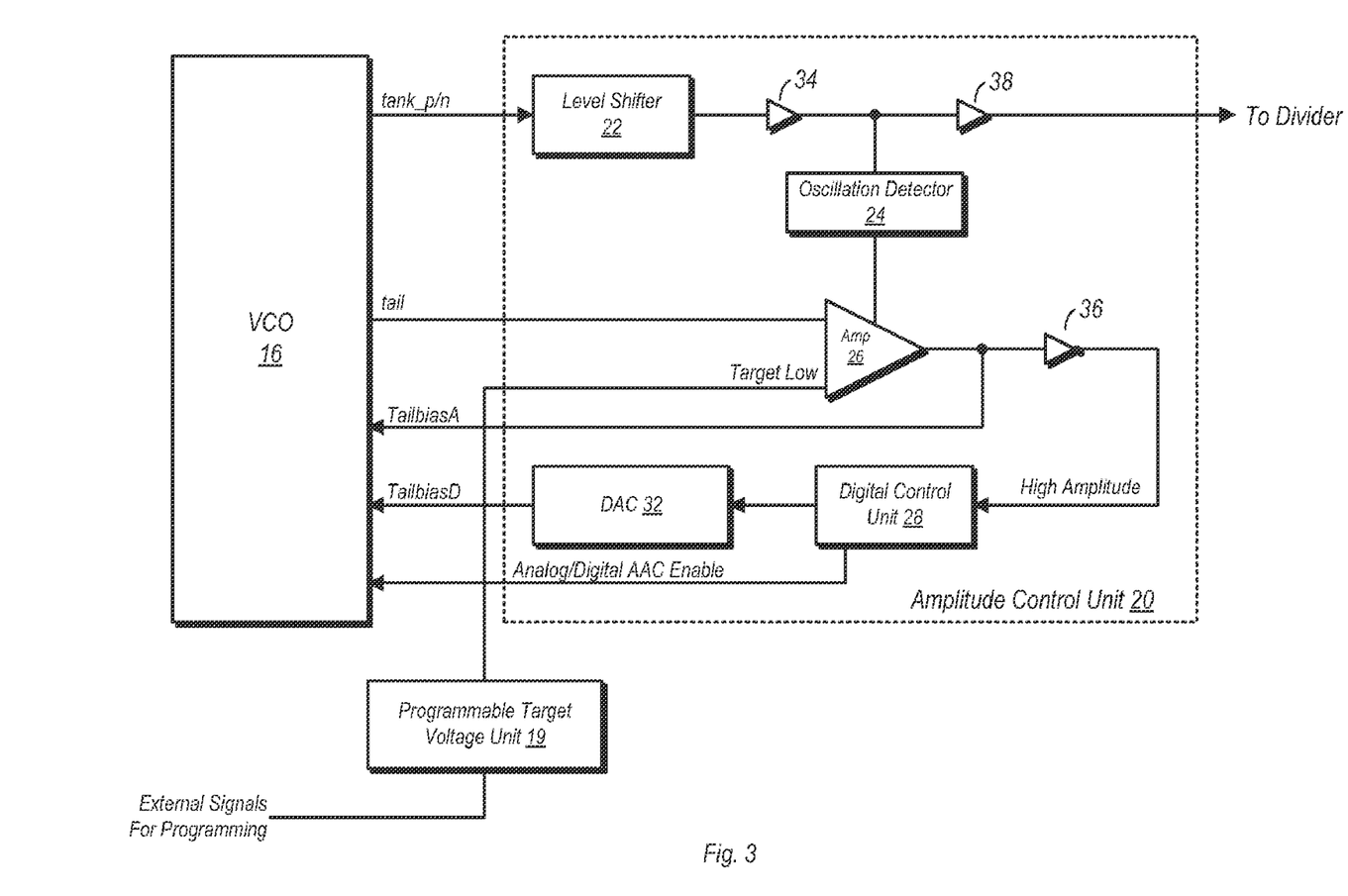
FIG. 3 is a block diagram of one embodiment of an amplitude control unit coupled to a VCO.

Amplitude Control Unit:

FIG. 3 is a block diagram illustrating amplitude control unit 20 in further detail. In the embodiment shown, amplitude control unit includes an analog portion comprising amplifier 26 and the node 'TailbiasA', and a digital portion including inverting amplifier 36, digital control unit 28, digital-to-analog converter (DAC) 32 and the node 'TailbiasD'. In one embodiment, amplitude control unit 20 may perform analog AAC using the analog portion or digital AAC using the digital portion. When performing analog AAC, transistor N4 of bias control circuit 17 may be active, and thus the voltage on node 'TailbiasA' may control the voltage on the tail node. When performing analog AAC, control of the VCO output signal output may be performed as a closed loop process. Performing digital AAC of the VCO output signal may be performed as an open-loop process. More particularly, the digital portion of amplitude control unit 20 may be used to perform a calibration routine during the initialization of the circuit, with no further control provided or required.

Amplifier 26 is coupled to the tail node of VCO 16 and is configured to determine the amplitude of the VCO output signal based on the tail node voltage. Monitoring the voltage on the tail node may allow for non-invasive monitoring of the amplitude of the VCO output signal. Instead of monitoring the amplitude via the tank nodes (i.e. 'tank_p' and 'tank_n'), which can cause loading, monitoring from the tail node has minimal (if any) effect on the output signal. Loading resulting from monitoring the amplitude via the tank nodes may adversely affect the desired operation of the VCO (e.g., inductive loading can alter the resonant frequency of the LC tank circuit and reduce the tuning range).

In addition to being coupled to the tail node, amplifier 26 is coupled to receive a target voltage, which may be compared to the tail node voltage. Amplifier 26 may amplify the difference between the tail node voltage and the target voltage. A signal proportional to this difference is output by amplifier 26 on the node 'TailbiasA'. When amplitude control unit 20 is using the analog portion to control the tail voltage (and thus control the amplitude of the VCO output signal), amplifier 20 may attempt to drive its output in such a manner to cause the voltage of the tail node to be equal to the target voltage. The closed loop analog portion may be enabled to control the tail voltage when the 'Analog AAC signal' is asserted, thereby activating transistor N4 as shown in FIG. 2. Transistor N6 (as also shown in FIG. 2) is coupled to receive, on its gate terminal, the output signal from amplifier 26 (i.e. the 'TailbiasA' node), and thus variations of the gate voltage of N6 may in turn vary the tail voltage.

The digital portion of amplitude control unit 20 may re-use the analog portion when performing digital AAC. More particularly, inverter 36 is coupled to receive the output of amplifier 26. Inverter 36 in the embodiment shown operates as an indicator circuit to provide an indication to digital control unit as to whether or not the amplitude of the VCO output signal is at its desired level. If the difference between the tail voltage and the target voltage is large enough, inverter 36 may output a logic low to digital control unit 28. Responsive to receiving the low, digital control unit 28 may provide signals to DAC 32 in order to change the bias provided on its output, 'TailbiasD'. Digital control unit 28 may implement any suitable algorithm to continue adjustment to DAC 32, and thus update the voltage of 'TailbiasD', as long as the output of inverter 36 is low. The voltage on node 'TailbiasD' may be received on a gate terminal of transistor N5 in bias control circuit 17. If transistor N3 is active (as a result of the assertion of the 'Digital AAC Enable' signal), adjustments to the gate voltage of transistor N3 may in turn result in changes to the voltage on the tail node.

Figure 4:
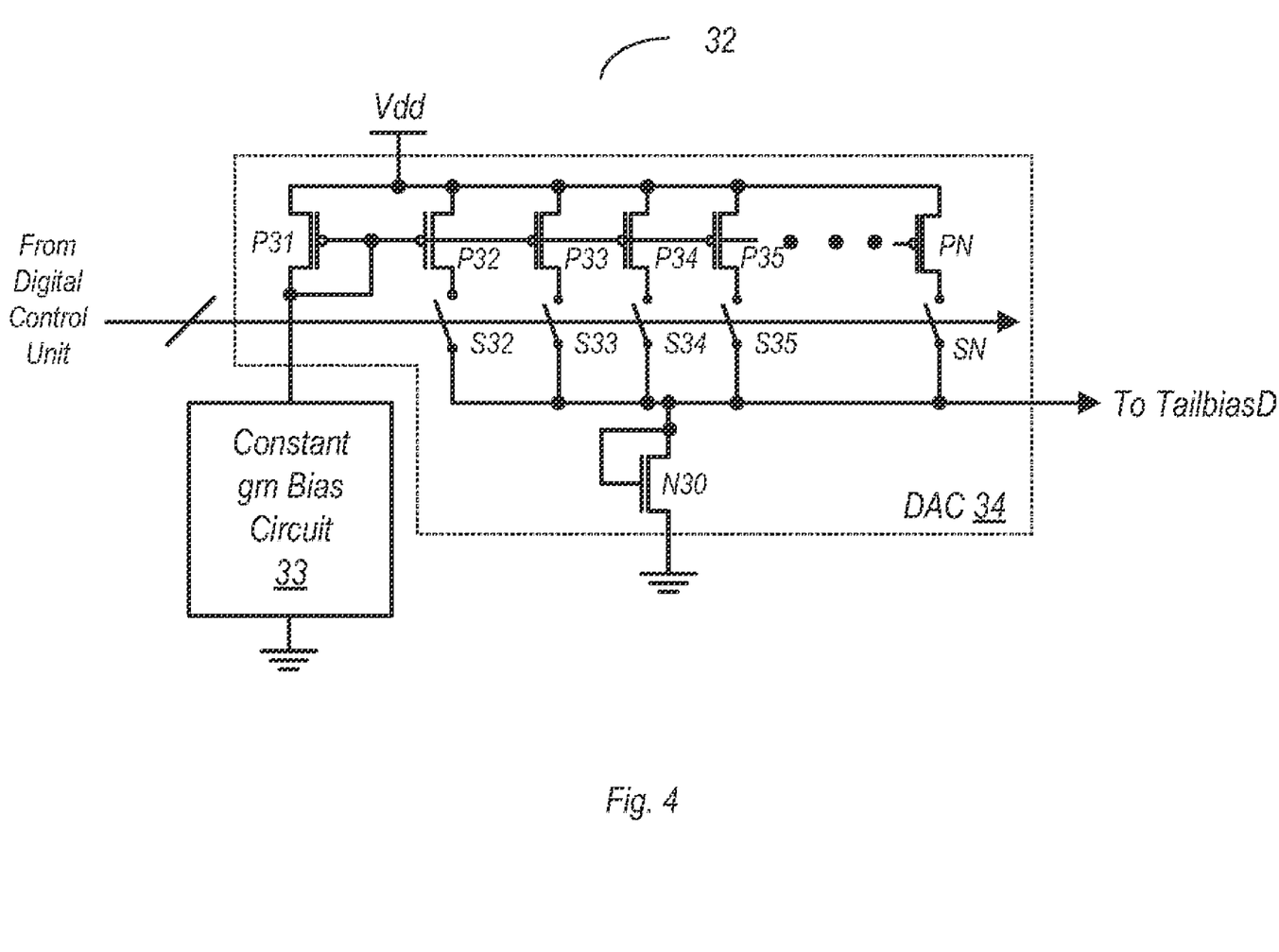
FIG. 4 is a schematic diagram of one embodiment of a digital-to-analog converter (DAC) configured to control a bias voltage provided to a bias control circuit.

An example of a DAC that may be used to implement DAC 32 is shown in FIG. 4. In the embodiment shown, DAC 32 includes a plurality of PMOS transistors P31-PN. Each of transistors P32-PN in the embodiment shown is coupled to a corresponding switch (e.g., S32-SN). As such, transistors P32-PN may only be active in this particular embodiment when the respective switch to which they are coupled is closed. Switches S32-SN may be selectively activated based on signals received from digital control unit 28. Each of transistors P32-PN may be coupled in a current mirror configuration with transistor P31 when activated as the result of the closing of its respective switch S32-SN.

In one embodiment, digital control unit 28 may begin an amplitude control algorithm by closing none of switches S32-SN. As such, only transistor P31 in the embodiment shown is active at the beginning of the algorithm, discharging through constant transconductance ($g_m$) bias circuit 33, which is used to reduce power supply and temperature sensitivity of the LC tank circuit in VCO 16. If the amplitude of the VCO output signal is still below the desired value, as reflected by the target voltage, digital control unit 28 may begin activating selected ones of transistors P32-PN. For example, digital control unit 28 may activate transistor P32 by closing switch S32. If the tail voltage is not less than the target voltage in this particular embodiment (and thus the amplitude of the VCO output signal is not at its desired level), digital control unit may then be activated P33 by closing switch S33. With each additional switch closed, the amount of current passing through diode-coupled transistor N30 may increase, and the voltage on the node 'TailbiasD' may change correspondingly. In turn, the voltage present on the tail node may be reduced, thereby increasing the amplitude of the VCO output signal. This routine may continue until the amplitude of the VCO output signal is at the desired level.

Returning now to FIG. 3, When the output of amplifier 26 falls sufficiently low (e.g., when the tail voltage is less than or equal to the target voltage), the output of inverter 36 may assert a 'High Amplitude' signal, indicating that the amplitude of the VCO output signal has reached the desired level. Responsive to receiving the 'High Amplitude' signal, digital control unit 28 may discontinue closing switches in DAC 32.

In one embodiment, the digital portion of amplitude control unit 20 may, upon start-up of VCO 16, perform a calibration routine to set the amplitude of the VCO output signal to a desired level. Digital control unit 28 may activate transistors of DAC 32 in the manner described above, discontinuing further activation of transistors once the desired amplitude has been reached. At this point of operation in this embodiment, no further intervention is performed, and thus control loop provided by amplitude control unit 20 is effectively opened. Utilizing open loop control through the digital portion of amplitude control unit 20 (as opposed to closed loop control using the analog portion) may reduce noise that may otherwise be introduced by the amplifier 26. Since transistor N4 is inactive when 'Analog AAC Enable' is de-asserted, noise on 'TailbiasA' may be largely isolated from the tail node, and thus from the LC tank circuit of VCO 16.

In addition to the functions discussed above, digital control unit 28 may also be configured to control whether amplitude control unit 20 operates in the analog, closed loop mode, or in the digital mode. This may be accomplished by controlling the shared signal line 'Analog/Digital AAC Enable'. The embodiment shown here is configured for use with bias control circuit 17 shown in FIG. 2, although many other embodiments are possible and contemplated. In this particular embodiment, 'Digital AAC Enable' is active high, while 'Analog AAC Enable' is active low on the shared signal line. In other embodiments, separate signal lines may be provided. In some embodiments intended for digital calibration and open loop control, but which re-use the analog portion, the 'Digital AAC Enable' line may be hardwired into a permanently active state and/or bias control circuit 17 may also be reconfigured accordingly.

As previously noted, a target voltage may be provided to amplifier 26 in order to provide a basis for calibration and control of the amplitude of the VCO output signal. In the embodiment shown, an external programmable target voltage unit 19 may provide the target voltage to amplifier 26. Target voltage unit 19 may program the target voltage based on signals received from an external source (e.g., a processor core, a user, another control unit, etc.). These signals are indicative of the desired amplitude of the VCO output signal and may be translated into the target voltage level that is provided to amplifier 26. In other embodiments, the target voltage may be set in other ways, such as through a voltage divider circuit or other circuitry capable of generation and holding a target voltage.

Amplitude control unit 20 also includes an oscillation detector 24 in this embodiment. Oscillation detector 24 may receive the VCO output signal provided on nodes 'tank_p' and 'tank_n' (shown as 'tank_p/n' in the drawing) via level shifter 22 and buffer amplifier 34. Level shifter 22 and buffer amplifier 34 may shift and amplify the voltage levels received from the 'tank_p' and tank_n nodes to levels that are appropriate for receiving by oscillation detector 24. In turn, oscillation detector 24 may determine whether or not the VCO output signal is actually oscillating. If the VCO output signal is not oscillating, e.g., it is stuck at a particular DC (direct current) level, oscillation detector 24 may cause amplifier 26 to increase the level of its output voltage, irrespective of any difference between the tail voltage and the target voltage. This may in turn cause the VCO output signal to begin oscillating, regardless of whether amplitude control unit 20 is utilizing analog or digital AAC. In the embodiment shown, an increase in the output voltage of amplifier 26 may in turn cause an increase on both of nodes 'TailbiasA' and 'TailbiasD'. As a result, the voltage on the tail node may be altered so as to cause the LC tank circuit to start producing an oscillating signal. Thus, the use of oscillation detector 24 may ensure oscillation and prevent a situation where the target and tail node voltages are equal but no oscillation is otherwise occurring.

In this particular embodiment, amplitude control unit 20 also includes an additional buffer amplifier 38. This amplifier may be used to provide the VCO output signal to the feedback loop that includes the divider shown in FIG. 2.

It is noted that the embodiments shown in FIGS. 2-4 are exemplary, and many other embodiments of a VCO 16, a bias control circuit 17, and an amplitude control unit 20, as well as the various components thereof, are possible and contemplated. For example, an embodiment of a circuit including VCO 16 and bias control circuit 17 having reversed polarities of the various devices therein is possible and contemplated, and moreover, wherein the bias control circuit is coupled between a supply voltage and a common node of the LC tank circuit.

Figure 5:
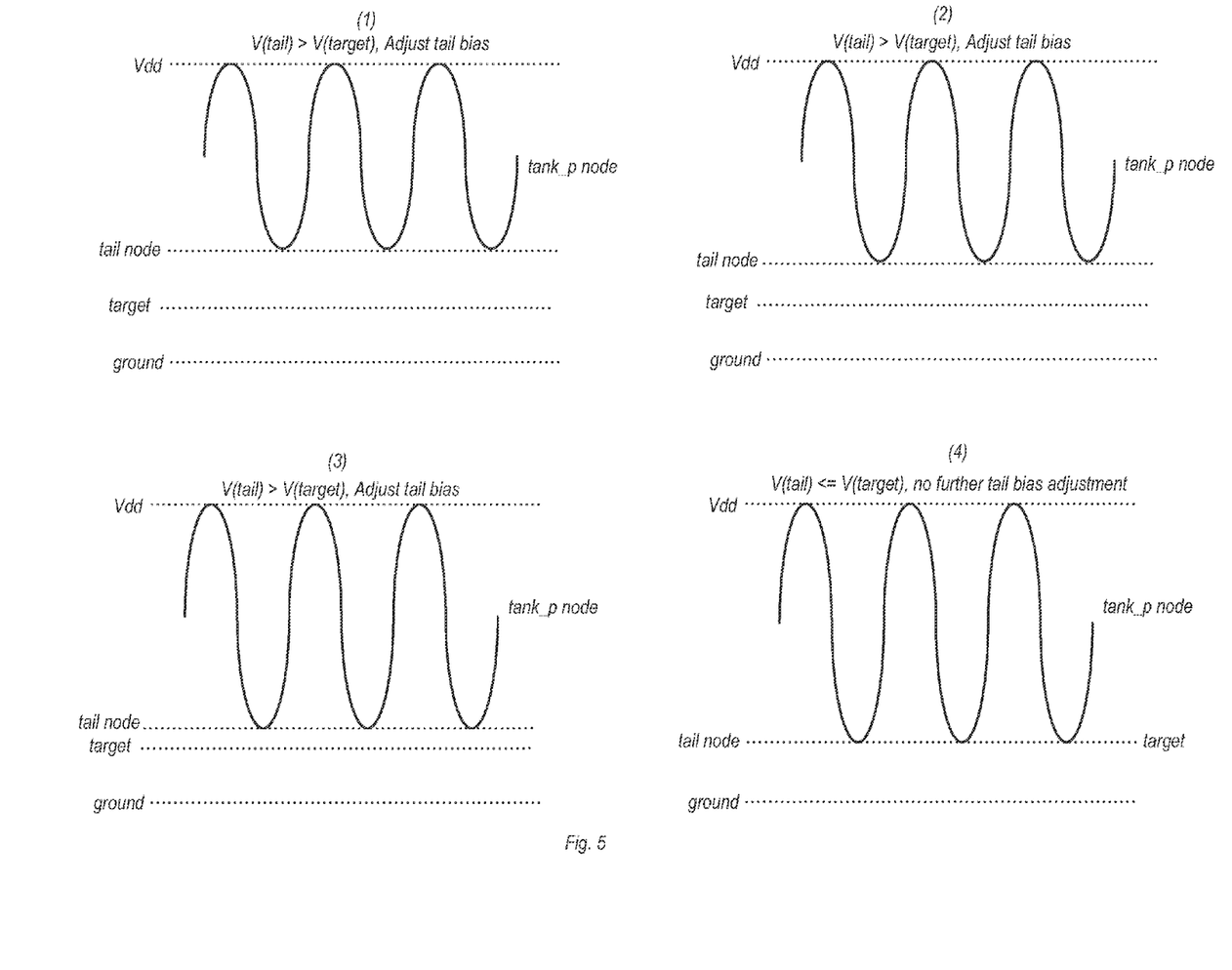
FIG. 5 is a graphic illustration of the operation of one embodiment of an amplitude control unit with respect to the amplitude of a VCO output signal.
Figure 6:
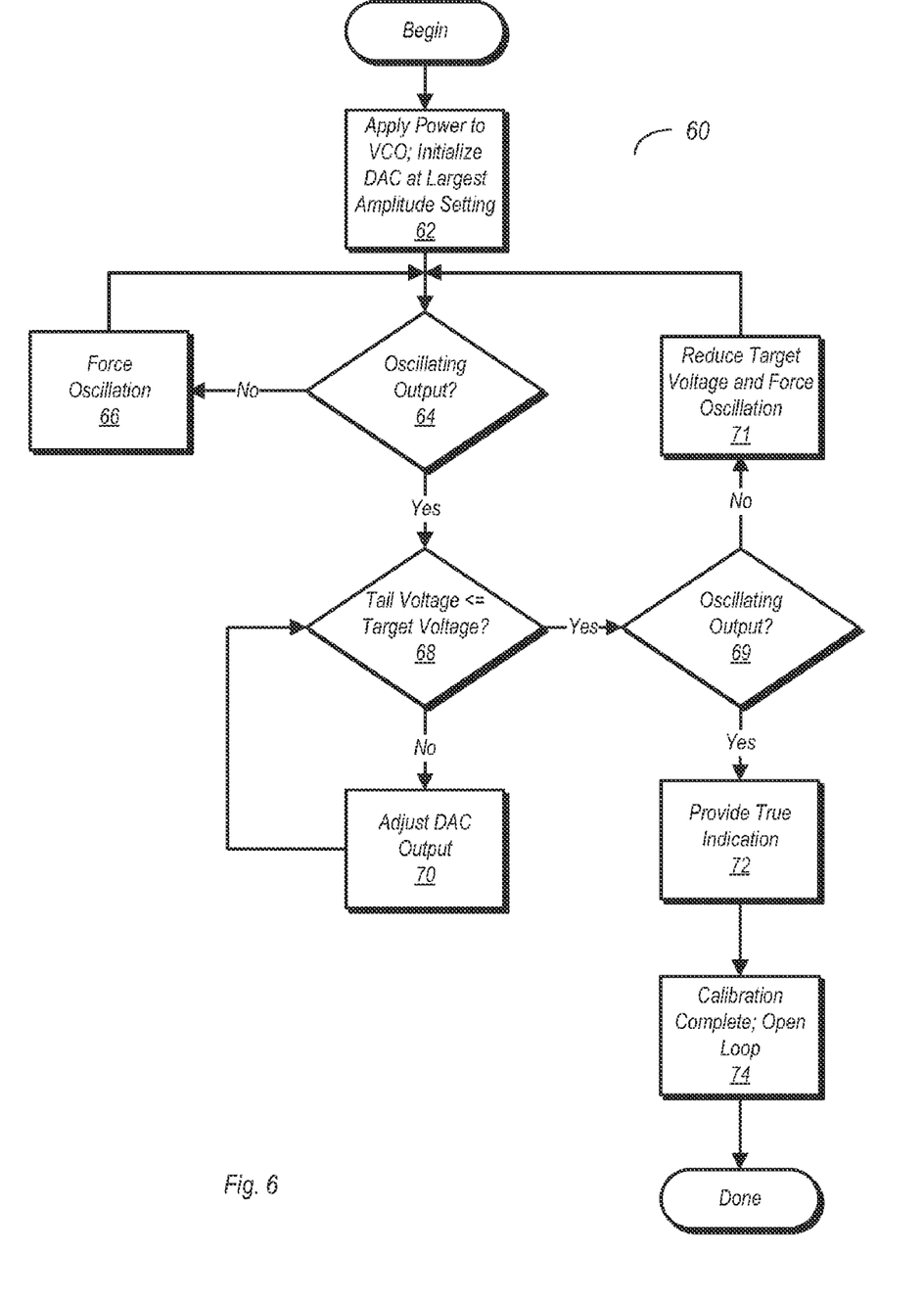
FIG. 6 is a flow diagram illustrating one embodiment of a method for calibrating the amplitude of an output signal provided by a VCO.

Amplitude Calibration for VCO:

FIGS. 5 and 6 are directed to various embodiments of a method for calibrating the amplitude of a VCO output signal. FIG. 5 graphically illustrates one such method, which may be performed by amplitude control unit 20 on VCO 16, as discussed above. For purposes of the example shown in FIG. 5, the oscillating signal is observed at node 'tank_p'. However, the method shown herein could also be illustrated by observing node 'tank_n'. The method that is graphically illustrated in FIG. 5 may be performed by amplitude control unit 20 utilizing either analog AAC or digital AAC.

As previously noted, the voltage swing of the VCO output signal in the embodiment of VCO 16 shown in FIG. 2 is between the supply voltage node 'Vdd' and the tail node. Accordingly, the adjusting the amplitude of the VCO output signal may require adjusting the tail node voltage until the voltage swing of the VCO output signal is between the supply node voltage and the target voltage.

At time (1) in the example, shown, the signal on node 'tank_p' is oscillating, although the tail node voltage is greater than the target voltage. Since the tail node is greater than the target voltage at this point in the operation, the VCO output signal in this example is not at its desired level. Responsive to the amplitude being less than the desired value, the tail bias may be adjusted by amplitude control unit 20. At time (2), the amplitude has increased with respect to time (1), but the amplitude of the output signal is still less than desired, as indicated by the tail node voltage being greater than the target voltage. Accordingly, another adjustment is performed. At time (3), the amplitude is greater than at time (2), and near, but not at, the desired level. A further adjustment is performed until, at time (4), the amplitude of the VCO output signal is at the desired level, as the voltage of the VCO output signal swings between the supply voltage node and the target voltage. At this point in the operation, no further adjustment of tail bias may be necessary. If amplitude control unit 20 is performing a calibration using the digital portion, digital control unit 28 may discontinue further adjustments, thereby opening the feedback loop used to control the tail voltage. If performing analog control of the tail voltage, adjustment may continue to be performed as necessary.

Turning now to FIG. 6, a flow diagram illustrating one embodiment of a method for calibrating the amplitude of an output signal provided by a VCO is shown. More particularly, the method may apply to a digital calibration of VCO 16 as shown in FIG. 2, using an embodiment of amplitude control unit 20 as shown in FIG. 3. However, the method shown herein may apply to other embodiments of a VCO and an amplitude control unit as well.

Method 60 begins with the application of power to the VCO and the initialization of DAC 32 at its largest amplitude setting (block 62). If, after the VCO is powered on, an oscillating output signal is not detected (block 64, no) by oscillation detector 24, the output of amplifier 26 may be increased by oscillation detector 24 in order to force oscillation (block 66). After an oscillating output signal has been detected (block 64, yes), the digital control unit may determine whether or not the tail voltage is less than or equal to the target voltage. This may be determined based on the outputs of amplifier 26 and inverter 36. Amplifier 26 may amplify the difference between the tail node voltage and the target voltage, with this difference being received by inverter 36 and causing it to output a low on the 'High Amplitude' node coupled to its output. If the tail voltage is greater than the target voltage (block 68, yes) and the output of inverter 36 is low (thereby indicating that the amplitude of the VCO output signal has not reached its desired level), digital control unit 28 may respond by adjusting the output voltage provided by DAC 32 (block 70). This process may repeat itself for a number of iterations, with digital control unit 28 selectively activating transistors of DAC 32 in order to adjust the voltage of the tail node toward the target voltage.

When the tail voltage has reached a level that is less than or equal to the target voltage (block 68, yes), thereby indicating that the amplitude of the VCO output signal has reached at least its desired value, another check may be performed to ensure that the VCO output signal is oscillating (block 69). If the VCO output signal is oscillating (block 69, yes), then inverter 36 may provide a true indication (block 72) on its output node 'High Amplitude'. This indication, which may be received by digital control unit 28, may indicate that the tail voltage is less than or equal to the target voltage, and thus amplitude of the VCO output signal has reached its desired level. Upon receiving this indication, digital control unit 28 may inhibit further changes to the state of DAC 32, effectively opening the control loop and completing the calibration (block 74). More particularly, digital control unit 28 may be configured such that no further control actions are performed to adjust the tail node voltage until the next time the circuit is powered on.

If the second check of the VCO output signal indicates that it is no longer oscillating (block 69, no), then the target voltage may be reduced and oscillation may be forced once again (block 71). Reducing the target voltage may increase the chances of success in forcing oscillation. At this point, the method may then return to block 64 and proceed as previously described.

Figure 7:
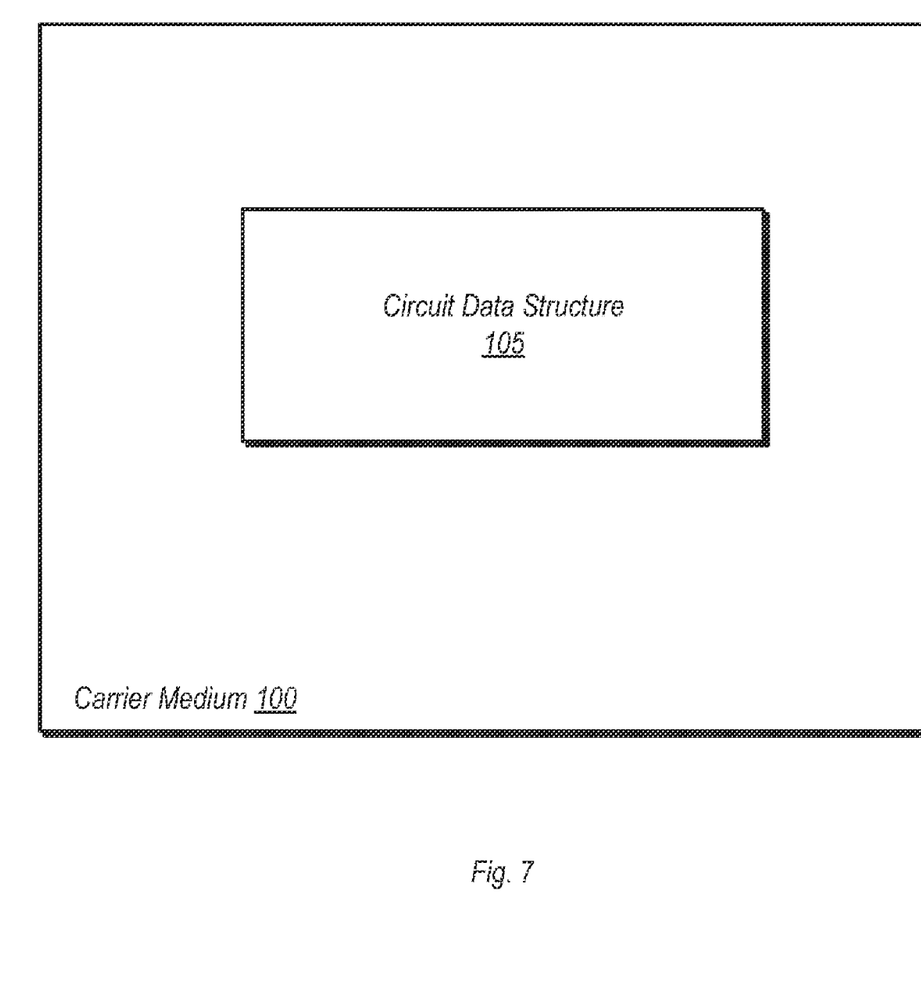
FIG. 7 is a block diagram of one embodiment of a carrier medium configured to store a data structure corresponding to an embodiment of a PLL having a VCO and a corresponding amplitude control unit.

Carrier Medium:

Turning next to FIG. 7, a block diagram of a computer accessible storage medium 100 including a database 105 representative of the PLL 10 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LP-DDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Generally, database 105 of PLL 10 carried on the computer accessible storage medium 100 may be a database which can be read by a program and used, directly or indirectly, to fabricate the hardware comprising PLL 10 (e.g., an integrated circuit upon which one or more instances of PLL 10 may be implemented). For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the PLL 10. The netlist may then be placed and routed to produce a data set describing geometric shapes to be applied to masks. The masks may then be used in various semiconductor fabrication steps to produce a semiconductor circuit or circuits that include circuitry corresponding to PLL 10. Alternatively, the database on the computer accessible storage medium 100 may be the netlist (with or without the synthesis library) or the data set, as desired.

While the computer accessible storage medium 100 carries a representation of PLL 10, other embodiments may carry a representation of any portion of the PLL 10, as desired, such as VCO 16, amplitude control unit 20, and so on.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
   a voltage controlled oscillator (VCO) configured to generate a VCO output signal;
   a bias control circuit coupled to a tail node of the VCO; and
   an amplitude control unit configured to determine an amplitude of the VCO output signal depending upon a voltage present at the tail node, wherein the amplitude control unit is configured to generate a bias voltage depending upon a target voltage and the voltage on the tail node;
   wherein the bias control circuit is configured to adjust the amplitude of the VCO output signal depending upon the bias voltage.

2. The circuit as recited in claim 1, wherein the amplitude control unit includes an analog portion and a digital portion, wherein the analog portion includes an amplifier configured to amplify a difference between the voltage on the tail node and the target voltage.

3. The circuit as recited in claim 2, wherein the digital portion is coupled to receive an output from the amplifier, wherein the digital portion includes:
   a digital-to-analog converter (DAC) having an analog output coupled to the bias control circuit;
   a digital control unit, wherein the DAC is configured to provide an output voltage at the analog output dependent upon one or more digital control signals received from the digital control unit;
   an indicator circuit configured to provide a first signal to the digital control unit when the voltage level on the tail node is greater than the target voltage and a second signal to the digital control unit when the voltage level on the tail node is less than or equal to the target voltage.

4. The circuit as recited in claim 3, wherein the digital control unit is configured to cause a variation of the output voltage of the DAC when the indicator circuit is providing the first signal, and wherein the digital control unit is further configured to discontinue causing variation of the output voltage of the DAC when the indicator circuit is providing the second signal.

5. The circuit as recited in claim 3, wherein the DAC includes a plurality of transistors coupled in parallel, and wherein the digital portion further comprises a constant transconductance bias circuit coupled to respective gate terminals of each of the plurality of transistors, wherein the digital control unit is configured to vary the output voltage of the DAC by activating selected ones of the plurality of transistors.

6. The circuit as recited in claim 3, wherein the bias control circuit includes a first transistor coupled to an output of the DAC and a second transistor coupled to the output of the amplifier, wherein the bias control circuit is configured to selectively couple one of the first or second transistors to the tail node depending on a state of an enable signal.

7. The circuit as recited in claim 3, wherein the amplitude control unit is configured to perform a calibration routine to set the amplitude of the VCO output signal during initialization of the circuit and further configured to discontinue the calibration routine responsive to assertion of the second signal.

8. The circuit as recited in claim 2, further comprising an oscillation detection circuit configured to determine whether or not the VCO output signal is oscillating and further configured to increase a voltage output from the amplifier responsive to detecting that the VCO output signal is not oscillating.

9. The circuit as recited in claim 8, wherein the amplitude control unit further comprises a level shifter coupled to receive and configured to shift voltage levels of the VCO output signal, and a buffer unit configured to receive a shifted VCO output signal from the level shifter and coupled to provide the shifted VCO output signal to the oscillation detection circuit.

10. The circuit as recited in claim 2, further comprising a target voltage unit configured to set the target voltage based on received programming signals.

11. The circuit as recited in claim 1, wherein the VCO includes an LC (inductive-capacitive) tank circuit.

12. A method comprising:
   determining an amplitude of a VCO (voltage controlled oscillator) output signal based on a voltage present at a tail node of the VCO;
   generating a first indication if the amplitude is not within a specified range;
   responsive to generation of the first indication, adjusting the amplitude, wherein adjusting the amplitude comprises adjusting the tail voltage;
   generating a second indication if the amplitude is within the specified range; and
   discontinuing adjustment of the amplitude responsive to generation of the second indication.

13. The method as recited in claim 12, wherein generating the first indication comprises determining if the voltage at the tail node is greater than a target voltage, and wherein generating the second indication comprises determining if the voltage at the tail node is less than or equal to the target voltage.

14. The method as recited in claim 13, wherein generating the first and second indications further comprises amplifying a difference between the voltage at the tail node and the target voltage, and logically inverting the amplified difference.

15. The method as recited in claim 12 further comprising forcing oscillation of the VCO output signal responsive to determining that the VCO output signal is not oscillating.

16. The method as recited in claim 12, further comprising a digital control unit causing an adjustment of an output voltage provided by a digital-to-analog converter (DAC) responsive to receiving the first indication.

17. The method as recited in claim 12, further comprising inhibiting adjustments of the tail voltage subsequent to assertion of the second signal.

18. The method as recited in claim 12, further comprising programming the target voltage prior to providing power to the VCO.

19. A computer readable medium comprising a data structure which is operated upon by a program executable on a computer system, the program operating on the data structure to perform a portion of a process to fabricate an integrated circuit including circuitry described by the data structure, the circuitry described in the data structure including:
   voltage controlled oscillator (VCO) configured to generate a VCO output signal;
   a bias control circuit coupled to a tail node of the VCO; and
   an amplitude control unit configured to determine an amplitude of the VCO output signal depending upon on a voltage present at the tail node, and wherein the amplitude control unit is configured generate a bias voltage dependent upon a target voltage and the amplitude of the VCO output signal;
   wherein the bias control circuit is configured to adjust the voltage at the tail node depending upon the received bias voltage.

20. The computer readable medium as recited in claim 19, wherein the amplitude control unit described in the data structure includes an analog portion and a digital portion, wherein the analog portion includes an amplifier configured to amplify a difference between the voltage on the tail node and the target voltage.

21. The computer readable medium as recited in claim 20, wherein the digital portion of the amplitude control unit described in the data structure includes:
   a digital-to-analog converter (DAC) having an analog output coupled to the bias control circuit;
   a digital control unit, wherein the DAC is configured to provide an output voltage at the analog output dependent upon one or more digital control signals received from the digital control unit; and
   an indicator circuit configured to provide a first signal to the digital control unit when the voltage level on the tail node is greater than the target voltage and a second signal to the digital control unit when the voltage level on the tail node is less than or equal to the target voltage.

22. The computer readable medium as recited in claim 19, wherein the data structure comprises one or more of the following types of data:
   HDL (high-level design language) data;
   RTL (register transfer level) data;
   Graphic Data System (GDS) II data.

* * * * *